(12) United States Patent
Kassir

(10) Patent No.: US 6,254,155 B1
(45) Date of Patent: Jul. 3, 2001

(54) APPARATUS AND METHOD FOR RELIABLY RELEASING WET, THIN WAFERS

(75) Inventor: Salman M Kassir, Paso Robles, CA (US)

(73) Assignee: Strasbaugh, Inc., San Luis Obispo, CA (US)

( * ) Notice: Subject to any disclaimer, the term of this patent is extended or adjusted under 35 U.S.C. 154(b) by 0 days.

(21) Appl. No.: 09/228,113

(22) Filed: Jan. 11, 1999

(51) Int. Cl.$^7$ ................................................. B25J 15/06
(52) U.S. Cl. ............................................ 294/64.1; 901/40
(58) Field of Search ............................ 294/1.1, 64.1, 294/64.3, 65, 902; 29/743; 269/21; 901/40

(56) References Cited

U.S. PATENT DOCUMENTS

| | | | |
|---|---|---|---|
| 3,377,096 | * | 4/1968 | Wood ................................ 294/64.1 |
| 3,556,578 | * | 1/1971 | Meyers ............................... 294/64.1 |
| 4,049,484 | * | 9/1977 | Priest et al. ...................... 294/64.1 X |
| 4,135,630 | | 1/1979 | Snyder et al. . |
| 4,389,064 | * | 6/1983 | Laverriere ......................... 294/64.1 |
| 4,831,270 | | 5/1989 | Weisenberger . |
| 4,904,012 | * | 2/1990 | Nishiguchi et al. ............. 294/64.1 |
| 5,622,400 | | 4/1997 | George . |
| 5,676,590 | | 10/1997 | Hiraoka . |
| 5,685,588 | | 11/1997 | Wong et al. . |
| 5,727,578 | | 3/1998 | Matthews . |
| 5,765,889 | | 6/1998 | Nam et al. . |
| 5,778,554 | | 7/1998 | Jones . |
| 5,795,355 | | 8/1998 | Moran . |

FOREIGN PATENT DOCUMENTS

| | | | | |
|---|---|---|---|---|
| 4040570 | * | 7/1991 | (DE) | ................................. 294/64.1 |
| 752469 | * | 7/1956 | (GB) | ................................. 294/64.1 |
| 60984 | * | 3/1991 | (JP) | ................................. 294/64.1 |
| 3-264287 | | 11/1991 | (JP) . | |
| 91576 | * | 4/1994 | (JP) | ................................. 294/64.1 |

* cited by examiner

Primary Examiner—Johnny D. Cherry
(74) Attorney, Agent, or Firm—Gray Cary Ware & Freidenrich

(57) ABSTRACT

In a type of end effector used for handling wafers in the semiconductor industry, the wafer is acquired by lowering the end effector until it almost touches the upper side of the wafer and then applying suction to lift the water into contact with a wafer contacting surface on the underside of the end effector. Release of the wafer is accomplished by relieving the suction or replacing it with a small overpressure. Wet thin wafers do not reliably release; the liquid spreads into a thin film between the upper side of the wafer and the wafer contacting surface, and the surface tension of this film causes the thin wet wafer to adhere to the wafer contacting surface. This problem is solved by affixing a sheet of a porous resilient material, such as open cell MYLAR®, to the wafer contacting surface.

11 Claims, 1 Drawing Sheet

APPARATUS AND METHOD FOR RELIABLY RELEASING WET, THIN WAFERS

BACKGROUND OF THE INVENTION

1. Field of the Invention

The present invention is in the field of semiconductor manufacturing and more specifically relates to an improvement that permits a robot to handle wet thin wafers more reliably.

2. The Problem

In a widely used process, electronic circuits are deposited, layer upon layer, on a substrate of insulative material. The substrate has the shape of a thin disc, called a wafer, which may typically be 200 millimeters in diameter and several hundred microns thick. During the manufacturing process, the wafers are transported from one work station to the next by a robot. The portion of the robot that comes in contact with the wafer is called an end effector. The type of end effector with which the present invention is concerned acquires a wafer by hovering over it and applying a vacuum, which draws the wafer against the underside of the end effector. Once acquired by the robot, the wafer may be transported to a different work station where the wafer is released by relieving the vacuum and/or applying a slight overpressure.

For dry wafers of any thickness, this technique for releasing wafers works reliably. However, a problem arises if the wafers are wet; for example, if they have been rinsed but not dried. With wet wafers, the liquid forms a film between the wafer and the undersurface of the end effector which acts to cause the wafer to adhere to the end effector. With thick wafers, the weight of the wafer usually overcomes the tendency to adhere, but for wafer thicknesses less than approximately 130 microns, the weight of the wafer is not sufficient to overcome the adhesion, and such wafers are not released reliably. To make matters worse, the thinner the wafer is, the less able it is to withstand any applied overpressure, so that approach is not viable.

In hope of finding a solution to this problem, the present inventor turned to the prior art.

3. The Prior Art

In U.S. Pat. No. 4,904,012 issued Feb. 27, 1990 to Nishiguchi et al. there is described an elastic member located on the wafer-contacting surface of an instrument for picking up and releasing wafers. The elastic member serves as a seal between the wafer and the instrument.

In U.S. Pat. No. 5,622,400 issued Apr. 22, 1997 to George, an apparatus is disclosed for solving the problem of acquiring very thin wafers that have warped into the shape of a potato chip and therefore are not dependably acquired by the end effector. George's solution is to use an air jet to push the wafer into sealing contact with the end effector, where it becomes held by the vacuum.

In U.S. Pat. No. 5,676,590 issued Oct. 14, 1997 to Hiraoka, there is described a polishing apparatus in which surface tension is used to hold a wafer to a pad while the wafer is being polished.

In U.S. Pat. No. 5,685,588 issued Nov. 11, 1997, Wong et al. describe a wafer pad, composed preferably of plastic or rubber, that supports the wafer from below. The pad is annular-shaped and vacuum is applied through the central opening to hold the wafer on the wafer chuck.

Although Wong et al. and Nishiguchi et al. describe a pad or cushion interposed between the wafer and the end effector, these pads are needed to provide a seal between the wafer and the end effector. None of the prior art patents known to the present inventor even suggests that a problem might exist when wet wafers are handled. Thus faced with a problem that apparently had not been addressed by prior art, the present inventor set out to find his own solution.

BRIEF SUMMARY OF THE INVENTION

It is an object of the present invention to provide a means whereby wet wafers less than approximately 130 microns in thickness can be reliably released from the end effector of a robot.

In accordance with the present invention, a sheet of a porous resilient material is bonded to the wafer-contacting surface of the end effector so as to be interposed between the wafer and the end effector. In one embodiment of the present invention, the sheet of porous resilient material is perforated by a pattern of holes that register with the vacuum ports of the end effector to avoid weakening the suction by which the wafer is drawn against the end effector.

In a preferred embodiment, the sheet of porous resilient material is composed of open cell MYLAR®. MYLAR® is a registered trademark of E. I. DuPont de Nemours and Company.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE INVENTION

Figure 1:
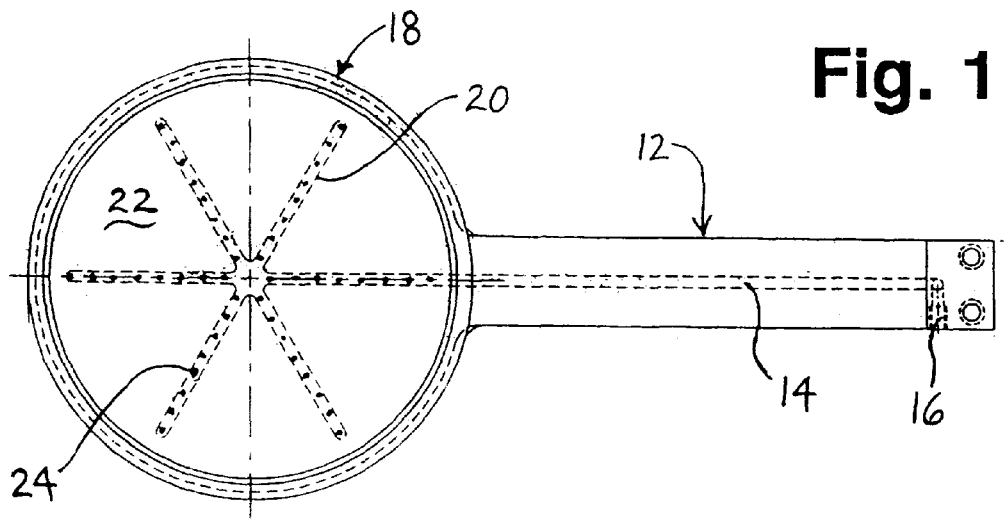
FIG. 1 is a bottom plan view partly cut away of the underside of an end effector of a type known in the prior art.

FIG. 1 shows a type of end effector known in the prior art. It includes an arm portion 12 through which a main duct 14 passes. The duct 14 permits pressurized gas or a vacuum to be applied to the end effector through the connector 16. The arm supports the wafer handling portion 18 of the end effector. The main duct 14 extends to a central portion of the wafer handling portion 18 where a number of branch ducts, of which the branch duct 20 is typical, diverge from the main duct 14. The branch ducts 20 open to the atmosphere through a number of orifices, of which the orifice 24 is typical.

In use, the robot (not shown) moves the wafer handling portion 18 into a position immediately above a wafer that is to be acquired. A vacuum is then applied through the connector 16, the main duct 14, and the branch ducts, which draws the wafer upward into contact with the wafer contacting surface 22. With the vacuum maintained, the wafer is held in that position as the robot transports the end effector to a different station, where the wafer is to be released. With the wafer handling portion 18 above the new station, the vacuum in the main duct is relieved and it may be replaced by pressurized gas at a pressure slightly exceeding the ambient atmospheric pressure. The pressurized gas is emitted through the orifices 24, thereby freeing the wafer from the wafer contacting surface 22. The released wafer drops slightly onto the new station, and the wafer handling portion is raised to a position further above the wafer.

The preceding paragraph describes how acquisition and release are normally effected, and experience has shown that for wafers that are approximately 200 millimeters in diameter this description is accurate provided the wafers are thicker than approximately 130 microns. For wafers thinner than that, two effects come into play. First, the thinner the wafer is, the more fragile it is, and the more susceptible it becomes to cracking or breaking due to rough handling. Accordingly, the air pressure supplied through the duct 14 is normally reduced or removed when such thin wafers are being released. Reducing the overpressure to zero also avoids the Bernoulli effect. The second effect that is noticed is that the thinner wafers weigh less, and therefore gravity does not help as much in drawing them downward from the wafer contacting surface 22. So long as the thin wafers, less than 130 microns thick approximately, are dry, the end effector of the prior art is capable of handling them reliably. However, if the wafers are not completely dry, even a small droplet of liquid on the upper surface of the wafer will spread to form a thin film of liquid between the wafer contacting surface 22 and the upper side of the wafer. It is believed that the surface tension of this thin film of liquid is responsible for the thin wafer adhering to the wafer contacting surface 22 from which it cannot be freed. Apparently, the surface tension forces exceed the weight of the wafer, and the application of an overpressure to the main duct 14 does not bring about release.

It has been suggested that a surfactant might be added to the liquid to reduce its surface tension, or that a liquid having less surface tension than water might be considered. However, to date no surfactant has been found that is compatible with the wafer processing chemistry, which requires high purity. A soapy film remaining on the wafer would be unacceptable.

After some experimentation, the present inventor hit upon means for assuring reliable release of very thin wet wafers.

Figure 2:
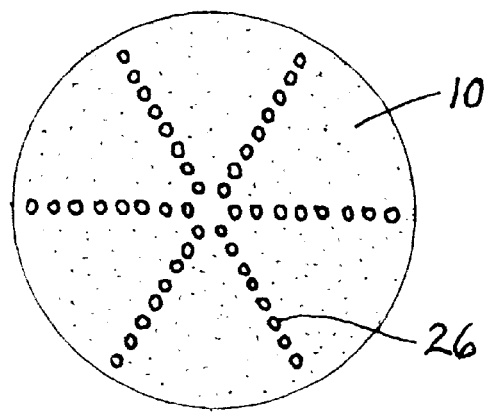
FIG. 2 is a bottom plan view of a sheet of porous resilient material in a preferred embodiment of the present invention.

The inventor cut a sheet of open cell porous MYLAR® into a disc shape as shown in plan view in FIG. 2. The inventor then produced holes in the sheet 10, of which the hole 26 is typical, having a pattern that registers with the pattern of orifices on the wafer contacting surface 22. This material is commercially available with a peel-off backing that covers a thin layer of adhesive. Once the peel-off backing has been removed, the perforated sheet 10 is applied to the wafer contacting surface 22, with care being taken to assure that the holes 26 are in registration with the orifices 24. The sheet 10 remains bonded to the wafer contacting surface 22 permanently.

Figure 3:
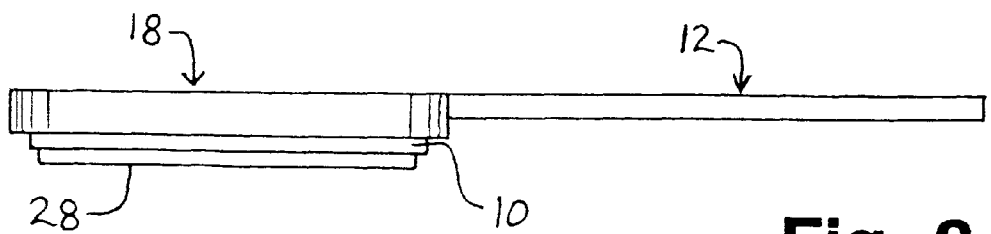
FIG. 3 is a side elevational view showing the sheet of FIG. 2 attached to the end effector of FIG. 1 after a wafer has been acquired.

Although the vacuum is capable of drawing air through the porous resilient material of the sheet 10, in the preferred embodiment, the holes 26 are provided so as not to reduce the suction effect. In a less preferred embodiment, no holes are produced in the sheet. When the sheet 10 of porous resilient material is in place on the wafer contacting surface 22, it has been found that thin wafers are released very reliably even though they may be wet before they are acquired by the end effector. Apparently, the droplets of moisture are absorbed into the porous resilient material of the sheet 10 by capillary action, and so little moisture remains unabsorbed that surface tension does not cause a problem. The sheet 10 remains effective regardless of how many wet wafers are transported in sequence, so it appears that the sheet 10 does not have to remain completely dry in order to be effective. FIG. 3 shows a wafer 28 drawn against the sheet 10 by a vacuum applied through the orifices 24 in the wafer handling portion 18.

In addition to preventing the thin wet wafers from sticking to the wafer contacting surface 22, the porous resilient sheet prevents scratching of the wafer. This advantage would not obtain if, for example, a layer of porous ceramic material were used in place of the porous resilient sheet. It is therefore important that the sheet be resilient, in addition to being porous.

Thus, means has been found that permits thin wafers (having a thickness of less than approximately 130 microns) to be reliably released from a suction-type end effector. In addition to preventing shutdown of the wafer processing machine due to failure to release the wafer, the present invention may also advantageously permit the omission of a drying operation from the manufacturing process, thereby making the process more efficient.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. An end effector capable of reliably releasing a thin wet wafer, the large surface area and small thickness of the wafer preventing the thin wafer from reliably releasing from the end effector, comprising:

a wafer handling portion having underside and having a wafer contacting surface located on the underside of said wafer handling portion wherein the wafer contacting surface has a plurality of vacuum orifices; and a sheet of absorbent, thin resilient material affixed to the wafer contacting surface wherein the sheet has a pattern of perforations corresponding to the vacuum orifices so as to lie between an acquired wafer and the wafer contacting surface to absorb the moisture on the wafer and reduce the surface tension of the moisture to prevent the moisture on the wafer from forming a film that holds the wafer onto the wafer contacting surface.

2. The end effector of claim 1 wherein said sheet of porous resilient material is composed of open cell MYLAR®.

3. In an end effector of a type in which a wafer may be retained against a wafer contacting surface on the underside of the end effector by a vacuum applied through orifices in the wafer contacting surface and in which the wafer may be released by relieving the vacuum, an improvement that results in reliable release of thin wet wafers, comprising:

a sheet of absorbent, thin resilient material affixed to the wafer contacting surface wherein the sheet has a pattern of perforations corresponding to the vacuum orifices so as to lie between an acquired wafer and the wafer contacting surface to absorb the moisture on the wafer and reduce the surface tension of the moisture to prevent the moisture on the wafer from forming a film that holds the wafer onto the wafer contacting surface.

4. The improvement of claim 3 wherein said sheet of porous resilient material is composed of open cell MYLAR®.

5. A method for reliably releasing a thin wet wafer from an end effector having a plurality of vacuum orifices, the large surface area and small thickness of the wafer preventing the thin wafer from reliably releasing from the end effector, the method comprising:

interposing a sheet of absorbent, thin resilient material between a wafer contacting surface of the end effector and the thin wet wafer wherein the sheet has pattern of perforations corresponding to the vacuum orifices; and absorbing moisture from the wafer with the sheet to reduce the surface tension of the moisture so as to prevent the moisture on the wafer from forming a film that holds the thin wafer onto the end effector.

6. The method of claim 5, wherein the wafer has a thickness of less than 130 microns.

7. The method of claim 6, wherein the wafer has a diameter of approximately 200 millimeters.

8. An end effector capable of reliably releasing a thin wet wafer, the large surface area and small thickness of the wafer preventing the thin wafer from reliably releasing from the end effector, comprising:

a wafer handling portion having an underside and having a wafer contacting surface located on the underside of said wafer handling portion; and means for reliably releasing the thin wet wafer to absorb moisture and reduce the surface tension of the moisture in order to prevent the moisture on the wafer from forming a film that holds the wafer onto the wafer contacting surface.

9. The end effector of claim 8, wherein the wafer has a thickness of less than 130 microns.

10. The end effector of claim 9, wherein the wafer has a diameter of approximately 200 millimeters.

11. The end effector of claim 8, wherein the wafer contacting surface has a plurality of vacuum orifices and wherein the reliable releasing means further comprises a sheet wherein the sheet has a pattern of perforations corresponding to the vacuum orifices.

\* \* \* \* \*